(12) United States Patent
Funada et al.

(10) Patent No.: US 6,326,840 B1
(45) Date of Patent: Dec. 4, 2001

(54) FEED-FORWARD DISTORTION COMPENSATION AMPLIFIER AND METHOD OF AMPLIFYING SIGNAL WITH FEED-FORWARD DISTORTION COMPENSATION

(75) Inventors: Kiyoshi Funada, Chitose; Nobuyasu Shimada, Sendai, both of (JP)

(73) Assignee: Kokusai Electric Co., Ltd., Nakano-Ku (JP)

( * ) Notice: Subject to any disclaimer, the term of this patent is extended or adjusted under 35 U.S.C. 154(b) by 0 days.

(21) Appl. No.: 09/482,554

(22) Filed: Jan. 13, 2000

(30) Foreign Application Priority Data

Aug. 27, 1999 (JP) .................................................. 11-241206

(51) Int. Cl.[7] ...................................................... H03F 3/66
(52) U.S. Cl. ............................................. 330/52; 330/151
(58) Field of Search ............................... 330/52, 149, 151

(56) References Cited

U.S. PATENT DOCUMENTS

| | | | | |
|---|---|---|---|---|
| 5,455,537 | * | 10/1995 | Larkin et al. | 330/52 |
| 5,485,120 | * | 1/1996 | Anvari | 330/151 |
| 5,796,304 | * | 8/1998 | Gentzier | 330/52 |
| 5,977,825 | * | 11/1999 | Mueck | 330/151 |
| 6,011,434 | * | 1/2000 | Sakai | 330/151 |
| 6,127,889 | * | 1/2000 | Myer | 330/149 |

* cited by examiner

*Primary Examiner*—Robert Pascal
*Assistant Examiner*—Henry Choe
(74) *Attorney, Agent, or Firm*—Wenderoth, Lind & Ponack, L.L.P.

(57) ABSTRACT

In a distortion detecting loop, an inputted RF signal is branched into two input signals by a distributor, one of the branched input signals is amplified by a main amplifier whose output signal is branched by a directional coupler, the branched output signal from the amplifier and the other branched input signal are inverted relatively to each other and combined together to extract a distortion component signal produced by the main amplifier with a detector. If the amplitude of the distortion component signal is greater than a predetermined threshold, then a control circuit changes the distortion component signal to a substitute signal having an amplitude smaller than the predetermined threshold, and controls a vector adjuster based on the amplitudes of the detected distortion component signal and the substitute signal in order to reduce the amplitude of the detected distortion component signal.

26 Claims, 9 Drawing Sheets

RAM MEMORY TABLE

| SAMPLING POINT | AMPLITUDE (VOLTAGE) | DIFFERENCE WITH PREVIOUS AMPLITUDE | OUTPUT AVERAGE POWER |
|---|---|---|---|
| S1 | 3.2 | — | — |
| S2 | 3.6 | +0.4 | — |
| S3 | 3.4 | −0.2 | 3.4 |
| S4 | 3.5 | +0.1 | 3.5 |
| S5 | 3.2 | −0.3 | 3.86 |
| S6 | 3.5 | +0.2 | 3.4 |
| S7 | 8.5 | +5.0 | (3.4) ← NOT USED |
| S8 | 3.4 | −0.1 | 3.36 |
| S9 | 3.1 | −0.3 | 3.33 |
| S10 | 3.3 | +0.2 | 3.3 |
| ... | ... | ... | ... |
| Sn | 3.6 | −0.3 | 3.5 |

FIG. 9 though the change in the output level of the detector 2 is automatically controlled so as to converge, it takes a certain period of time until the detector 2 returns to its normal control mode, and the distortion detecting loop tends to be unlocked, causing the feed-forward distortion compensation amplifier to operate in error.

FEED-FORWARD DISTORTION COMPENSATION AMPLIFIER AND METHOD OF AMPLIFYING SIGNAL WITH FEED-FORWARD DISTORTION COMPENSATION

BACKGROUND OF THE INVENTION

1. Field of the Invention

The present invention relates to a feed-forward distortion compensation amplifier and a method of amplifying a signal with feed-forward distortion compensation for use in a repeater for high-frequency radio communications, and more particularly to a feed-forward distortion compensation amplifier and a method of amplifying a signal with feed-forward distortion compensation for suppressing erroneous operation even when distortion control quantities in a distortion detecting loop and a distortion compensating loop are brought out of balance by inputting an instantaneous peak power level is inputted.

2. Description of the Related Art

Repeaters used in mobile radio systems such as portable telephone systems amplify radio waves from a base station and transmit amplified radio waves to mobile stations. In order to simultaneously amplify radio waves in multiple channels, the amplifiers in the repeaters are required to be considerably linear. However, there is a certain limitation on the linearity of the amplifiers in the repeaters.

Some repeaters incorporate a distortion compensation amplifier referred to as a nonlinear distortion compensation circuit, i.e., a SAFF (Self-Adjusting Feed-Forward) circuit, for canceling a distortion due to a nonlinear operation of the amplifier caused when an excessively high signal due to an instantaneous peak power level is applied to the amplifier.

Known feed-forward distortion compensation amplifiers of the above type are disclosed Japanese laid-open patent publications Nos. 5-315847 and 8-78965, for example.

The disclosed feed-forward distortion compensation amplifiers generally have a distortion detecting loop and a distortion compensating loop that are connected in series with each other. In the distortion detecting loop, an input signal is branched into two input signals, and one of the branched input signals is amplified by an amplifier whose output signal is branched. The branched output signal from the amplifier and the other branched input signal are inverted relatively to each other and combined together to extract a distortion component signal produced by the amplifier. In the distortion compensating loop, the distortion component signal outputted from the distortion detecting loop and the output signal from the amplifier are inverted relatively to each other and combined together to obtain an amplifier output signal from which the distortion component signal produced by the amplifier has been removed.

Figure 8:
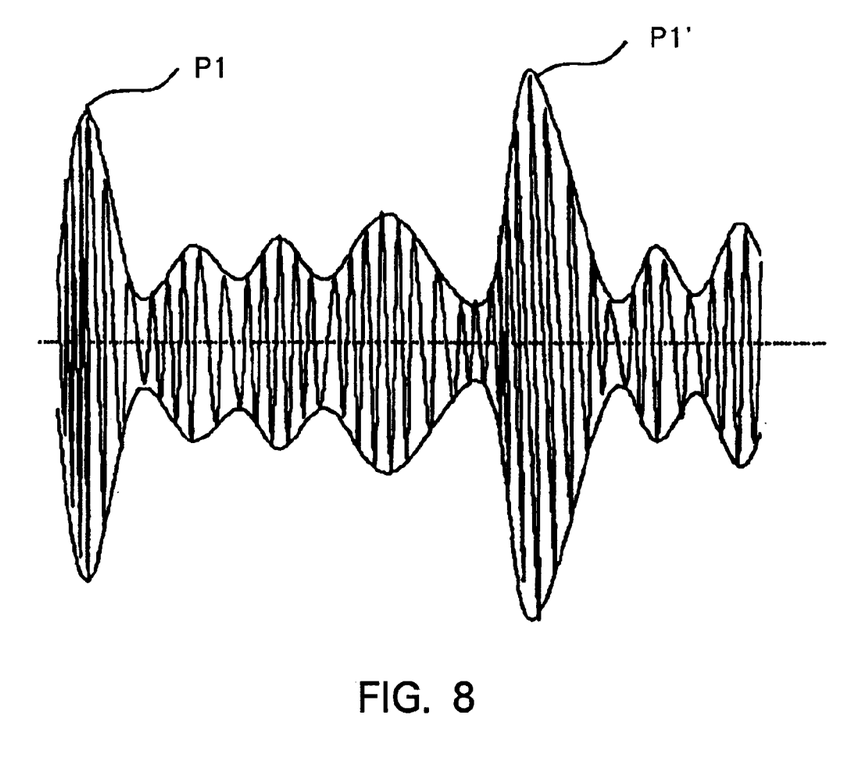
FIG. 8 is a diagram showing the waveform of the envelope of a CDMA input signal with peak power levels added thereto.

If a CDMA (Code Division Multiple Access) signal having a signal envelope that contains instantaneous peaks P1, P1' as desired waves, as shown in FIG. 8 of the accompanying drawings, is inputted to the above feed-forward distortion compensation amplifier, then the peak power becomes close to or higher than the saturation level, resulting in the generation of a distortion having an extremely high level due to the amplification in the distortion detecting loop.

Figure 9:
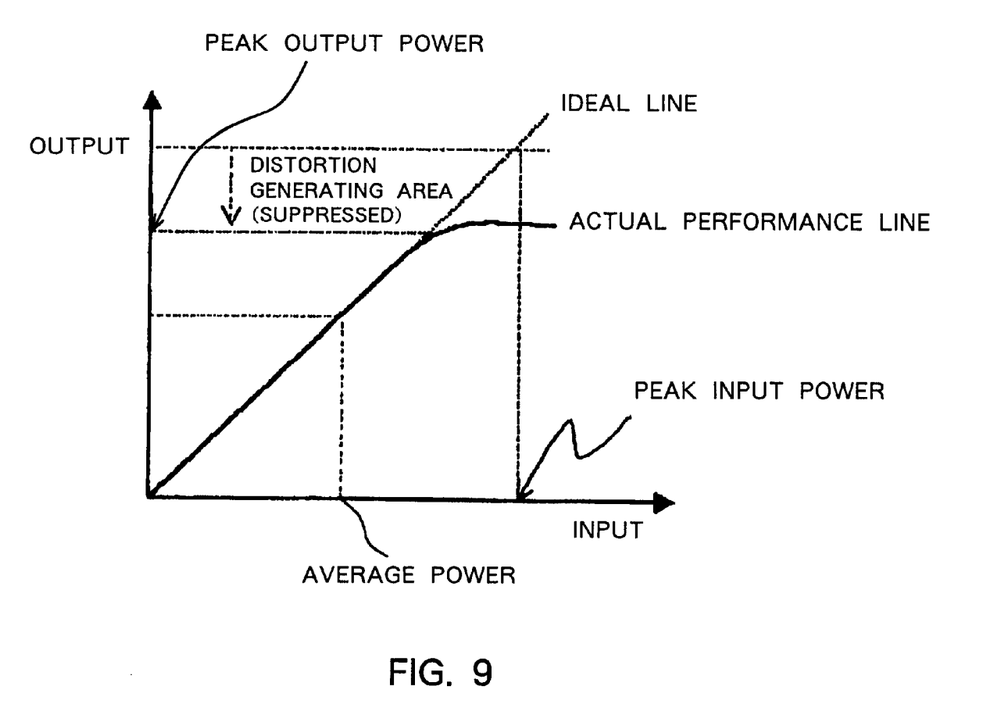
FIG. 9 is a diagram illustrative of input/output characteristics of a main amplifier.

The above generation of a distortion is illustrated in FIG. 9 of the accompanying drawings. FIG. 9 shows input/output characteristics of a general main amplifier for use in the distortion detecting loop of a feed-forward distortion compensation amplifier. If the gradient of an actual performance line of the main amplifier deviates from an ideal line, then the output voltage is suppressed as it reaches the saturation level, forcing the main amplifier to generate a distortion.

Figure 6:
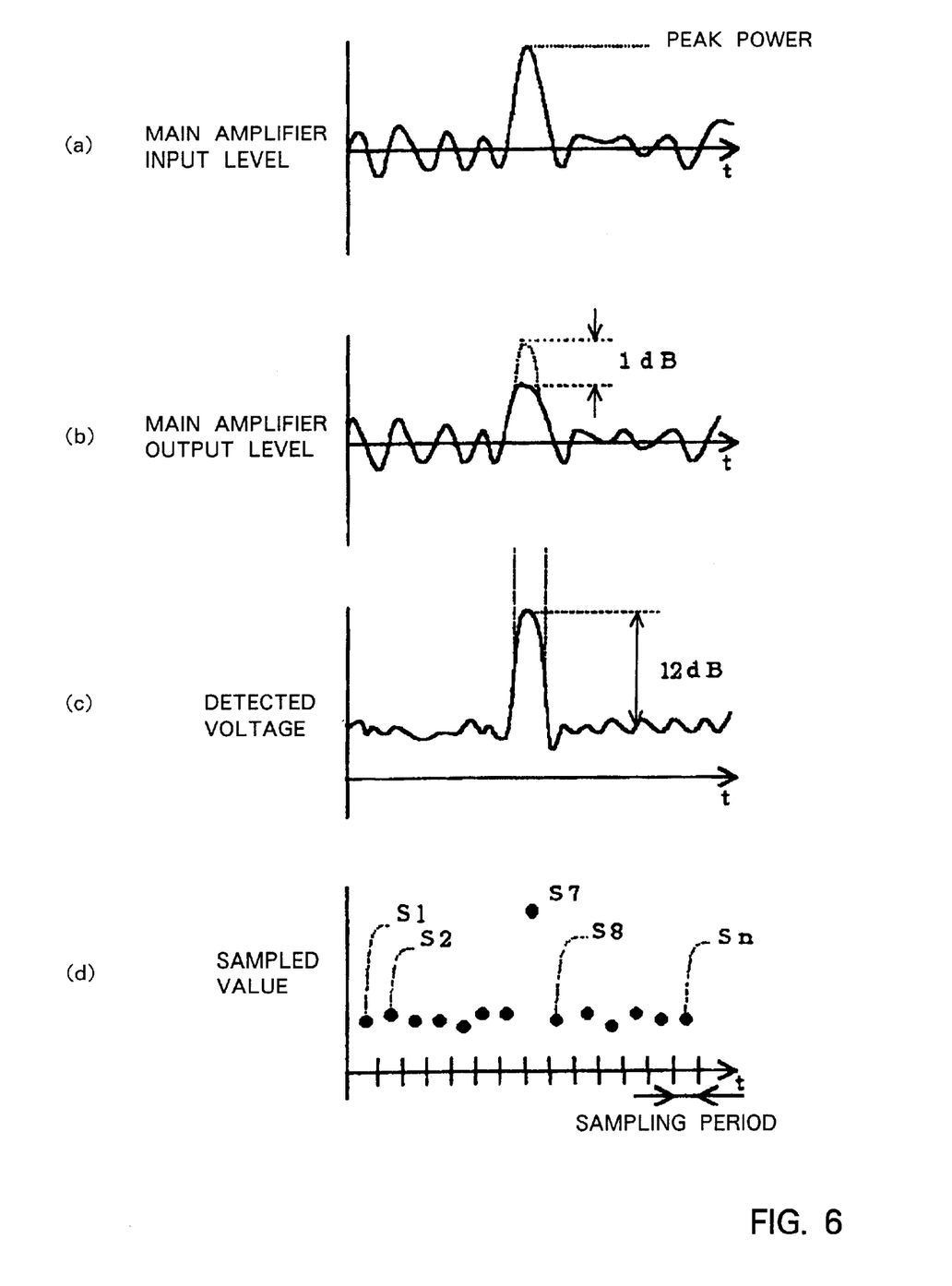
FIGS. 6(a) through 6(d) are diagrams showing the waveform of an input level of a main amplifier, the waveform of an output level of the main amplifier, the waveform of a detected voltage, and the waveform of a sampled voltage.

If a signal having an instantaneous peak as shown in FIG. 6(*a*) of the accompanying drawings is inputted to the main amplifier, then an output signal from the main amplifier is suppressed by 1 dB as shown in FIG. 6(*b*) of the accompanying drawings, with the result that a canceled distortion quantity is about 18 dB according to the equation (1) shown below.

If the main amplifier operates at all times with a canceled distortion quantity of 30 dB or greater, then, as shown in FIG. 6(*c*) of the accompanying drawings, the distortion canceling level is lowered due to the instantaneous peak level, allowing a level that is about 12 dB higher than the normal canceled distortion quantity to be inputted to a distortion removing loop.

In the above example, it is known that the canceled distortion quantity is expressed by the following equation (1):

$$\text{Canceled distortion quantity} = 10 \log(1+10^{d/10} - 2 \times 10^{d/20} \times \cos p)$$

where d represent the amplitude deviation (dB), and p the phase deviation (deg.).

With the conventional feed-forward distortion compensation amplifiers, if the input signal contains an instantaneous peak, then the amplifiers are unable to perform their normal amplifying operation. If such an amplifier is used in a repeater amplifier unit, then it tends to lower the quality of radio communications.

Figure 1:
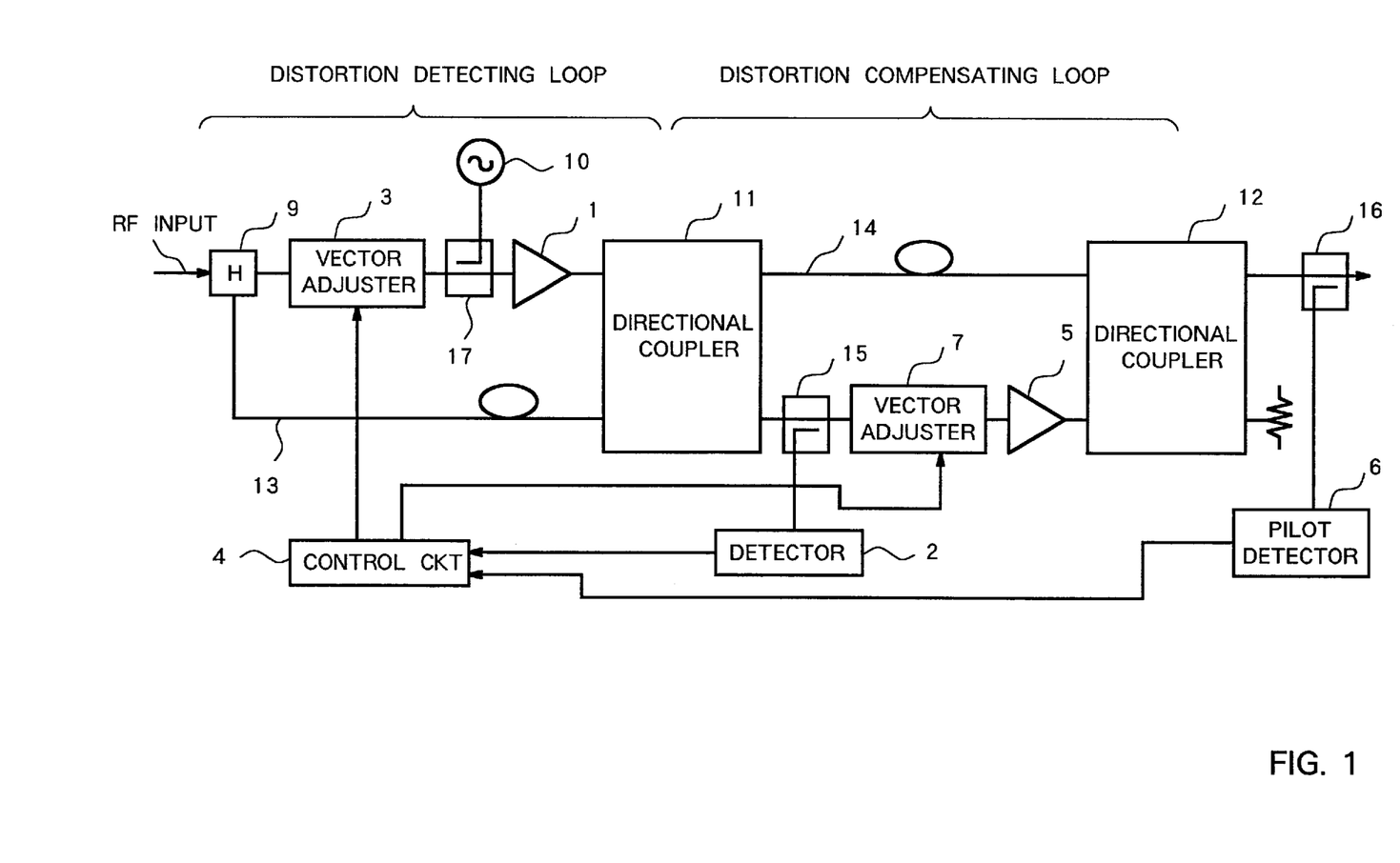
FIG. 1 is a block diagram of a feed-forward distortion compensation amplifier according to an embodiment of the present invention.

FIG. 1 of the accompanying drawings shows a feed-forward distortion compensation amplifier according to the present invention. The above shortcoming will be described below with reference to FIG. 1.

In the distortion detecting loop, a vector adjuster 3 is controlled to minimize an output signal from a detector 2, i.e., to minimize a distortion component signal from a main amplifier 1 which is extracted by a canceling process performed by the distortion detecting loop.

When the detector 2 detects a peak power level, the distortion detecting loop starts a control operation to change the vector adjuster 3 in order to keep the distortion detecting loop in balance. However, since the output level of the detector 2 quickly increases because of the inputted peak level, even if the change in the output level of the detector 2 is automatically controlled so as to converge, it takes a certain period of time until the detector 2 returns to its normal control mode, and the distortion detecting loop tends to be unlocked, causing the feed-forward distortion compensation amplifier to operate in error.

Figure 7:
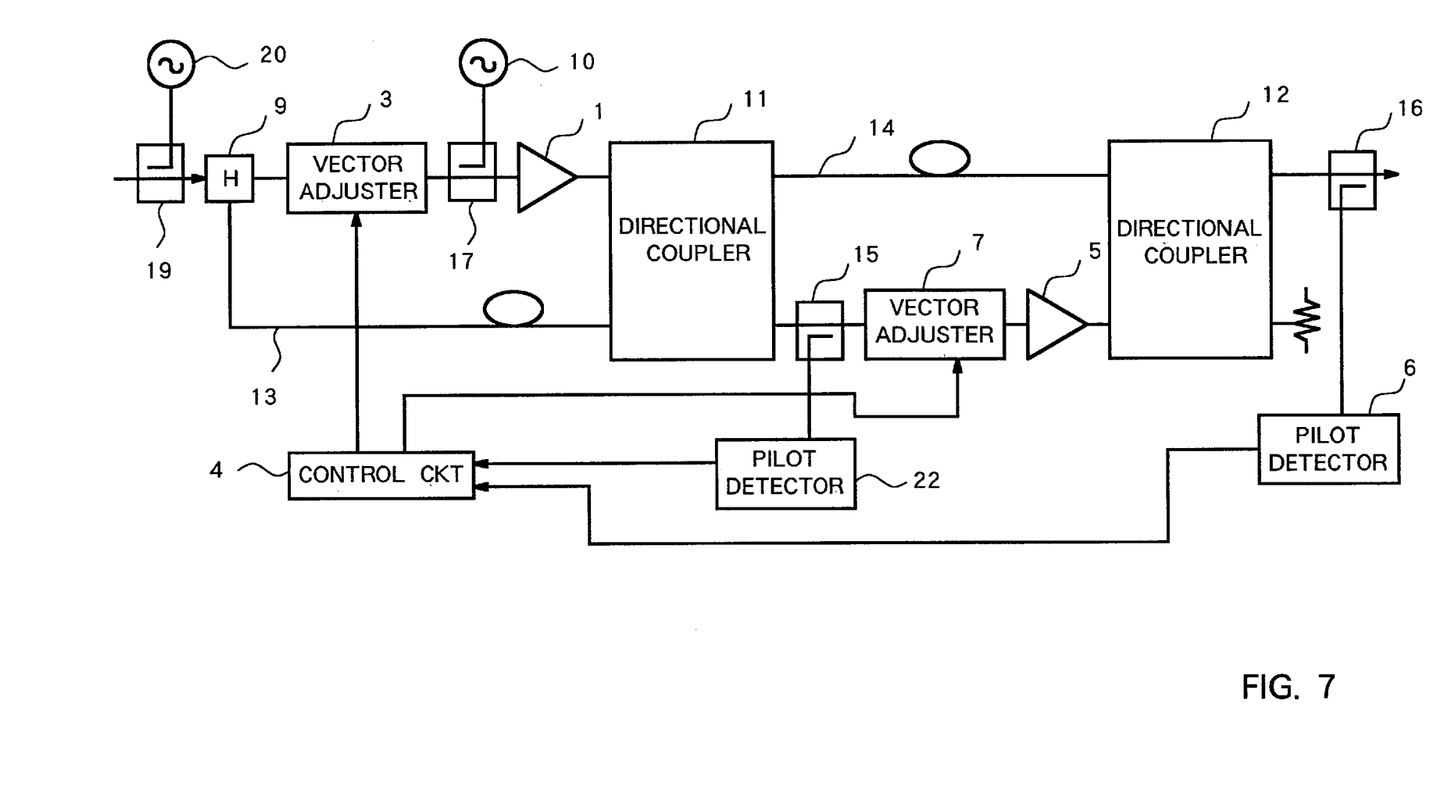
FIG. 7 is a block diagram of a feed-forward distortion compensation amplifier according to another embodiment of the present invention.

The above problems holds true for a feed-forward distortion compensation amplifier which employs a pilot signal as an input signal for distortion detection (corresponding to the embodiment of the present invention shown in FIG. 7 of the accompanying drawings) so that a control process for distortion detection can be performed in the absence of an input signal. If an input signal (communication signal) such as an RF signal to be amplified contains an instantaneous peak, then a control process for distortion compensation cannot properly be performed on the input signal, with the result that desired waves are liable to suffer distortions upon amplification thereof.

SUMMARY OF THE INVENTION

It is therefore an object of the present invention to provide a feed-forward distortion compensation amplifier which is capable of stably performing an appropriate control process for distortion compensation.

Another object of the present invention is to prevent a long period of time from being consumed for erroneous control operation and recovery of a distortion detecting loop even when a main amplifier operates in the vicinity of a saturated level due to an instantaneous peak power level.

According to the present invention, there is provided a feed-forward distortion compensation amplifier having a distortion detecting loop and a distortion compensating loop that are connected in series with each other, wherein in the distortion detecting loop, an input signal is branched into two input signals, one of the branched input signals is amplified by an amplifier whose output signal is branched, the branched output signal from the amplifier and the other branched input signal are inverted relatively to each other and combined together to extract a distortion component signal produced by the amplifier, and in the distortion compensating loop, the distortion component signal outputted from the distortion detecting loop and the output signal from the amplifier are inverted relatively to each other and combined together to obtain an amplifier output signal from which the distortion component signal produced by the amplifier has been removed.

Adjusting means disposed in the distortion detecting loop adjusts the branched output signal from the amplifier and the other branched input signal to amplitudes and phases inverted relatively to each other for thereby extracting the distortion component signal produced by the amplifier. The distortion component signal is detected by detecting means. If the amplitude of the distortion component signal is greater than a predetermined threshold, changing means changes the distortion component signal to a substitute signal having an amplitude smaller than the predetermined threshold. Adjustment control means controls the adjusting means based on the amplitudes of the detected distortion component signal and the substitute signal in order to reduce the amplitude of the distortion component signal detected by the detecting means.

If the input signal contains an instantaneous peak, then the instantaneous peak generates an extremely large amplification distortion. When the adjusting means is controlled based on the distortion, a long period of time needs to be consumed for erroneous control operation and recovery of the distortion detecting loop.

According to the present invention, in the event of the generation of an extremely large amplification distortion in excess of a predetermined threshold, a substitute signal whose amplitude is smaller than the predetermined threshold is used rather than the distortion component signal, and the adjusting means is controlled based on the substitute signal for stable adjustments.

While the principles of the present invention are applicable to a feed-forward distortion compensation amplifier for detecting a distortion of a communication signal applied as an input signal to the amplifier for distortion compensation, the principles of the present invention are also applicable to a feed-forward distortion compensation amplifier having means for generating a pilot signal having a particular frequency, the pilot signal being applied as an input signal to the distortion detecting loop and its distortion being detected for distortion compensation.

The changing means may comprise means for, if a sampled value of the detected distortion component signal is greater than a predetermined amplitude threshold, changing the sampled value to a substitute sampled value having an amplitude smaller than the predetermined amplitude threshold, the adjustment control means comprising means for controlling the adjusting means based on the detected sampled value and the substitute sampled value.

Preferably, the substitute sampled value may comprise a sampled value having an amplitude smaller than the predetermined amplitude threshold, previously obtained at a sampling point where the sampled value is greater than the predetermined amplitude threshold, or an average value of sampled values having amplitudes smaller than the predetermined amplitude threshold, previously obtained at a sampling point where the sampled value is greater than the predetermined amplitude threshold. Using a past history of sampled values at the same sampling point as the substitute signal, more appropriate adjustment control can be made as different substitute signals which do not match past and future sampled values are not employed.

Furthermore, nearby sampled values including the above sampled value may be changed to substitute sampled values, and the adjusting means may be controlled based on those sampled values.

Using a past history of sampled values, but not a sampled value near the sampling point where an instantaneous peak occurs, it is possible to make stable adjustment control in a manner to be free of the effect of the instantaneous peak.

The distortion detecting loop may have second pilot signal generating means for adding a second pilot signal to the input signal applied to the amplifier, the distortion compensating means comprising second adjusting means for adjusting the branched output signal from the amplifier and the distortion component signal from the distortion detecting loop to amplitudes and phases inverted relatively to each other, an auxiliary amplifier for amplifying the distortion component signal extracted by the distortion detecting loop, and second detecting means for detecting a distortion component signal of the second pilot signal from an output signal of the amplifier from which a distortion component produced by inverting and combining the distortion component signal and the output signal from the amplifier with each other, has been removed. The changing means may comprise means for, if the detected distortion component signal of the second pilot signal has an amplitude greater than a predetermined threshold, changing the distortion component signal to a substitute signal having an amplitude smaller than the predetermined threshold, and the adjustment control means may comprise means for controlling the adjusting means and the second adjusting means based on the amplitudes of the detected distortion component signal and the substitute signal in order to reduce the amplitudes of the distortion component signals detected by the detecting means and the second detecting means.

In the feed-forward distortion compensation amplifier, if a signal having an instantaneous peak as shown in FIG. 6(a) is inputted to the main amplifier, then the main amplifier of the distortion detecting loop (amplifier 1 in FIG. 1) has an output level as shown in FIG. 6(b). It is assumed that the instantaneous peak power level of the input signal is suppressed by 1 dB. At this time, the distortion detecting loop is brought out of balanced by 1 dB, and a canceled distortion quantity is lowered by 18 dB according to the equation (1) shown above. Therefore, if the main amplifier operates at all times with a canceled distortion quantity of 30 dB with respect to the average power, the voltage detected by the detecting means (detector 2 in FIG. 1) has a waveform as shown in FIG. 6(c).

According to the present invention, the detected value is read by an A/D converter in a controller (control circuit 4 in FIG. 3) serving as the changing means and the adjustment control means, and sampled at a certain time, and the adjusting means (vector adjuster 3 in FIG. 1) is controlled without using a sampled value of the instantaneous peak.

Preferably, the adjusting means is not controlled with a single sampled value, but an average value of sampled values. At this time, the sampled values are averaged except for the instantaneous peak power level. If a plurality of sampled values are produced in the interval of the peak power level of the signal, then the sampled values near the peak power level may be discarded, and a substitute value may be used.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

FIG. 1 shows in block form a feed-forward distortion compensation amplifier according to an embodiment of the present invention.

As shown in FIG. 1, the feed-forward distortion compensation amplifier generally has a distortion detecting loop and a distortion compensating loop. In the distortion detecting loop, an input signal is branched into two input signals, and one of the branched input signals is amplified by an amplifier whose output signal is branched. The branched output signal from the amplifier and the other branched input signal are inverted relatively to each other and combined together to extract a distortion component signal produced by the amplifier. In the distortion compensating loop, the distortion component signal outputted from the distortion detecting loop and the output signal from the amplifier are inverted relatively to each other and combined together to obtain an amplifier output signal from which the distortion component signal produced by the amplifier has been removed.

In the distortion detecting loop, an RF signal to be amplified is inputted to a distributor 9 which distributes the RF signal to a path in which the RF signal flows via a vector adjuster 3 and a main amplifier 1 to a first directional coupler 11 and another path in which the RF signal flows along a delay line 13 to the first directional coupler 11.

Figure 2:
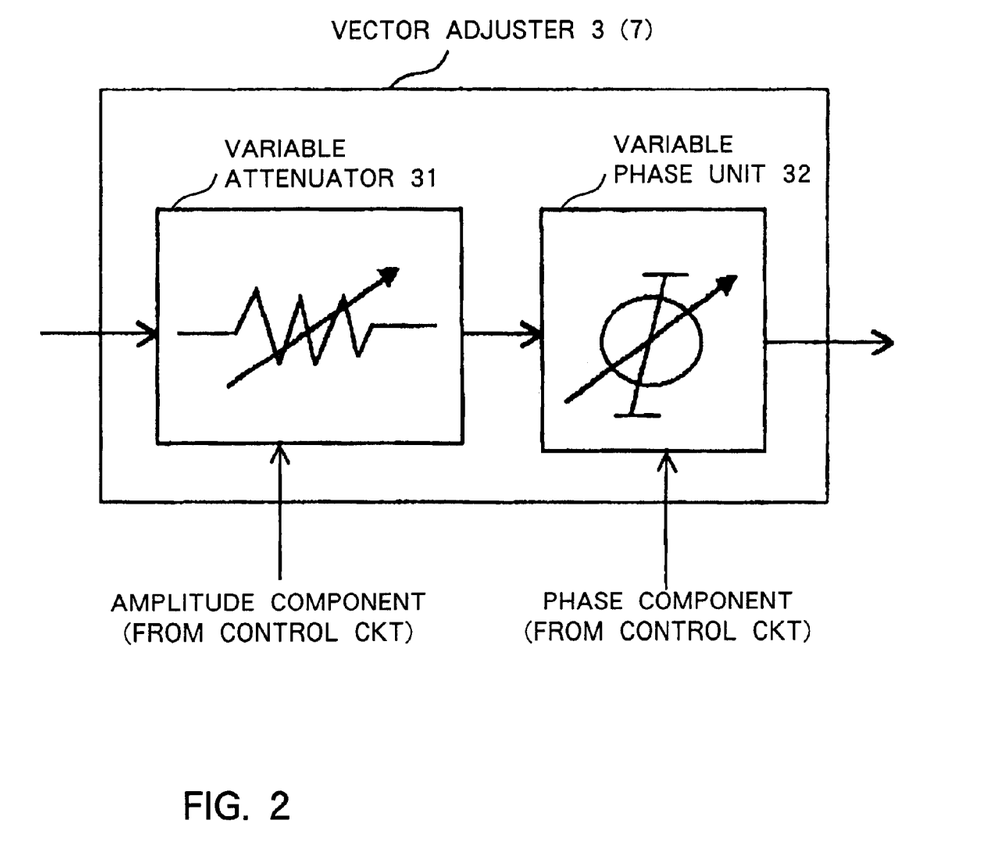
FIG. 2 is a block diagram of a vector adjuster in the feed-forward distortion compensation amplifier shown in FIG. 1.

As shown in FIG. 2, the vector adjuster 3 comprises a variable attenuator 31 for varying the amplitude of a signal and a variable phase unit 32 for varying the phase of a signal. The vector adjuster 3 serves to adjust the amplitude and phase of the inputted RF signal. Another vector adjuster 7 in the distortion compensating loop is of a structure identical to the vector adjuster 3.

In this embodiment, since the vector adjustment is controlled depending on the detection in the distortion compensating loop, a pilot signal having a certain frequency generated by a pilot signal generator 10 is coupled to an input signal to the main amplifier 1 by a coupler 17.

The first directional coupler 11 uses an output signal from the main amplifier 1 as an output signal thereof, and branches the output signal from the main amplifier 1, combines the branched output signal with the RF signal from the delay line 13 in opposite phase with each other, and uses the combined signal as another output signal. Specifically, the first directional coupler 11 supplies the RF signal and the pilot signal amplified by the main amplifier 1 to a delay line 14 of the distortion compensating loop, and combines the RF signal delayed by the delay line 13 for a delay equal to the delay caused by the vector adjustment and the amplification, with the amplified RF signal and pilot signal in opposite phase, and supplies the combined signal, i.e., the amplified pilot signal and a distortion component signal of the inputted RF signal which is produced by the main amplifier 1, to a vector adjuster 7 and an auxiliary amplifier 5 of the distortion compensating loop.

A detector 2 detects a DC component from the signal supplied to the vector adjuster 7 and the auxiliary amplifier 5 via a coupler 15, thus detecting the amplitude of the signal, and supplies the detected DC component to a control circuit 4. Therefore, the amplitude of the distortion component signal contained in the signal is inputted to the control circuit 4.

Based on the amplitude of the distortion component signal, the control circuit 4 controls the vector adjuster 3 to control adjusted amplitude and phase quantities in order to minimize the distortion component signal detected by the detector 2, i.e., to maximize a canceled distortion quantity obtained by the distortion compensating loop.

The distortion compensating loop adjusts the signal supplied from the first directional coupler 11 to the vector adjuster 7 and the auxiliary amplifier 5 in phase and amplitude, and further amplifies the signal. A second directional coupler 12 combines the amplified signal with a signal delayed by the delay line 14 for a delay equal to the delay caused by the vector adjustment and the amplification, in opposite phase with each other, and outputs a signal (the RF signal and the pilot signal that have been amplified) from which the distortion component signal has been canceled.

In this manner, with the feed-forward distortion compensation amplifier, the distortion detecting loop including the main amplifier 1 to be compensated for detects a distortion component other than the input signal through opposite-phase signal combination, and inputs the detected distortion component to the distortion compensating loop. The distortion compensating loop amplifies and adjust in phase the inputted distortion component, combines the distortion component with the signal amplified by the main amplifier 1. Thus, the distortion component is canceled to compensate for the distortion in the input signal.

A pilot detector 6 detects a pilot signal component from an output signal from the second directional coupler 12 via a coupler 16, thus detecting the amplitude of the signal, and applies the amplitude of the signal to the control circuit 4. That is, the amplitude of an amplification distortion component signal contained in the pilot signal is inputted to the control circuit 4.

Based on the amplitude of the distortion component signal, the control circuit 4 controls the vector adjuster 7 to control adjusted amplitude and phase quantities thereof in order to minimize the distortion component signal detected by the pilot detector 6.

Figure 3:
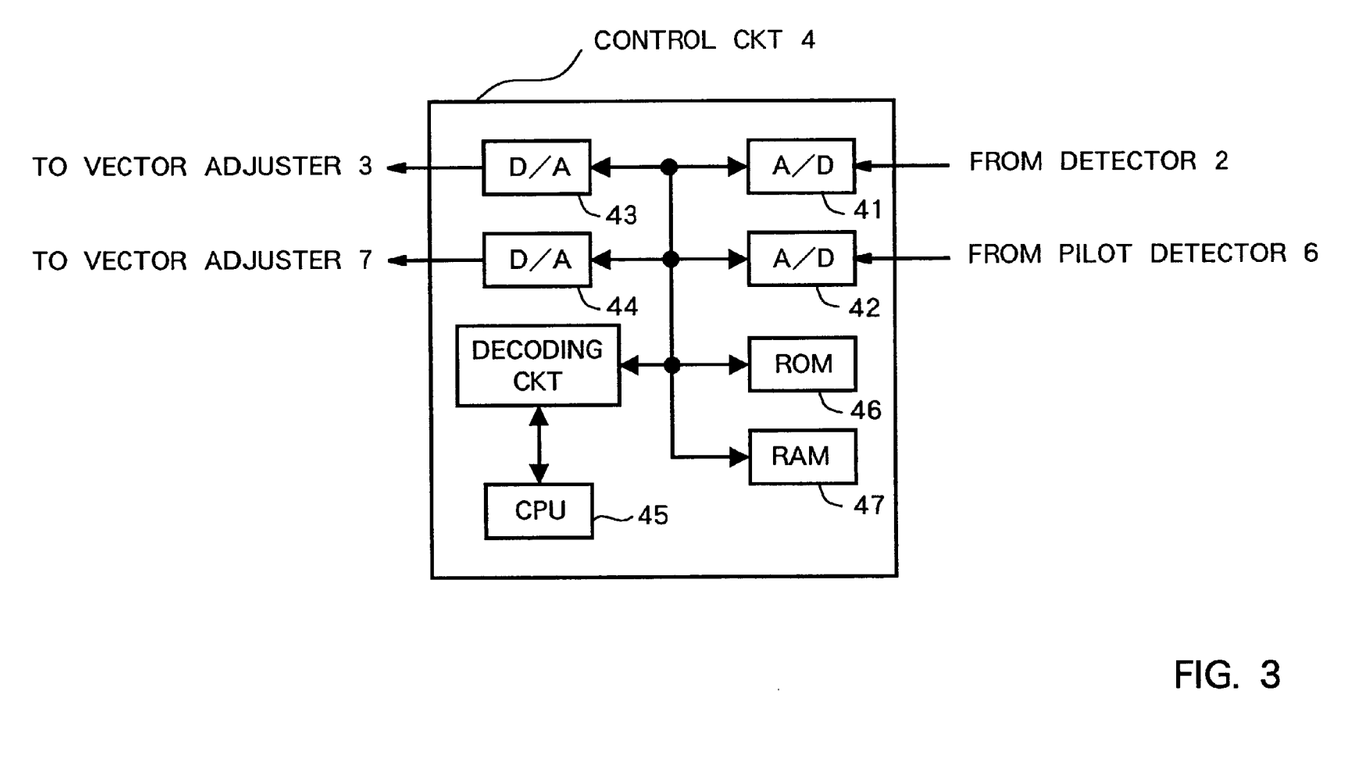
FIG. 3 is a block diagram of a control circuit in the feed-forward distortion compensation amplifier shown in FIG. 1.

The control circuit 4 is of a structure shown in FIG. 3. A detected signal inputted from the detector 2 and a detected signal from the pilot detector 6 are converted into digital values by A/D converters 41, 42, respectively. Control signals produced by a CPU 45 based on the detected signals are converted by D/A converters 43, 44, respectively, into analog signals, which are outputted to the vector adjusters 3, 7, respectively.

The control circuit 4 has a ROM 46 which stores a control program to be executed by the CPU 45. When the CPU 45 executes the control program, it performs a vector adjustment control process using sampled values and substitute values, as described later on.

Figure 4:
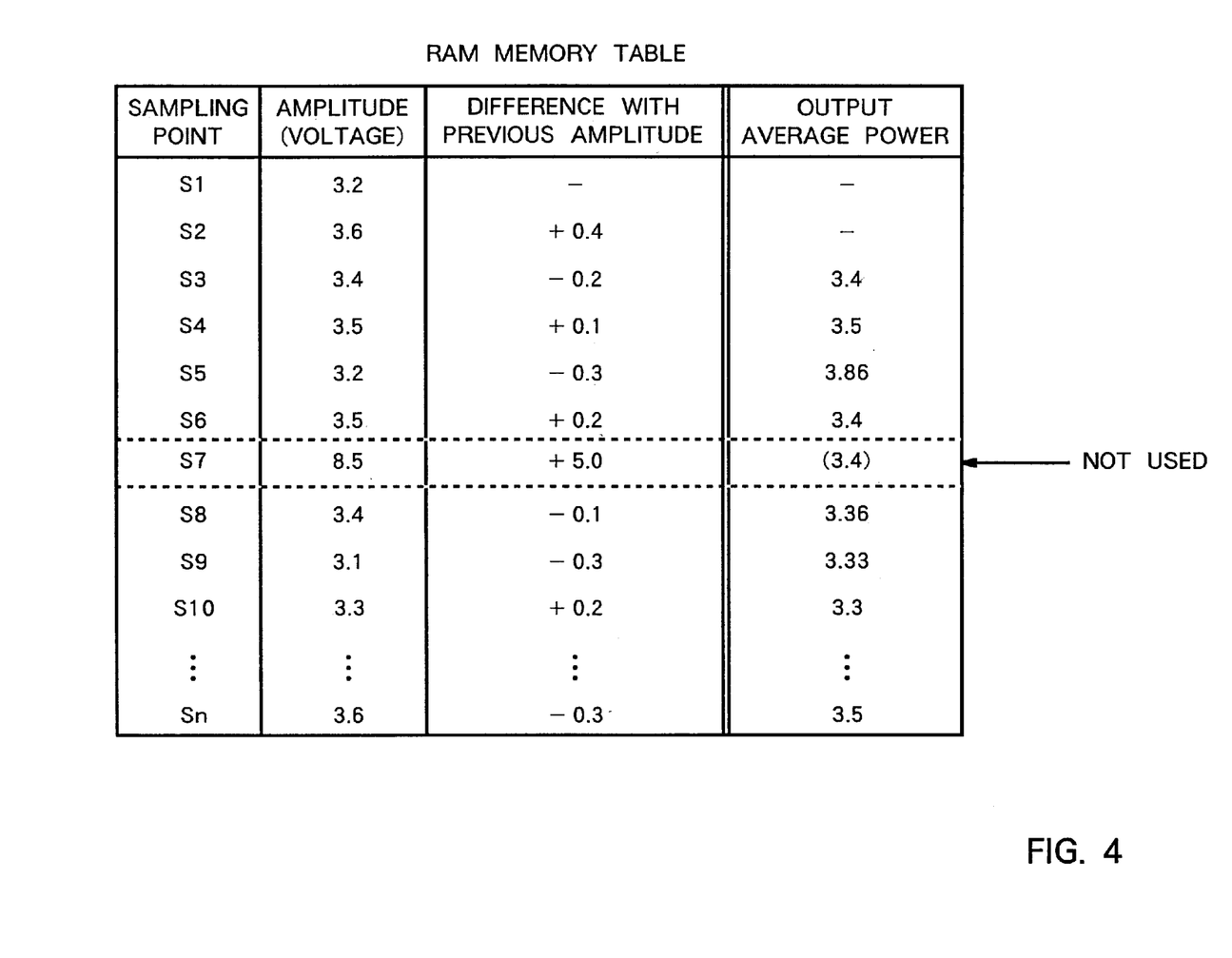
FIG. 4 is a diagram of a memory table in the control circuit shown in FIG. 3.

The control circuit 4 has a RAM 47 which stores a memory table as shown in FIG. 4. Specifically, the memory table stores information as to amplitudes produced when the detected signals from the detectors 2, 6 are sampled. Using average power values of the amplitudes stored in the memory table, the vector adjusters 3, 7 are controlled for their adjustments while precluding detected values affected by instantaneous peaks, i.e., detected values whose amplitudes are extremely large.

The information stored in the memory table will specifically be described below with respect to a signal detected by the detector 2, i.e., the distortion component signal of the RF signal which is introduced by the main amplifier 1 and the pilot signal.

If the signal detected by the detector 2 has a waveform as shown in FIG. 6(c), then when it is inputted to the control circuit 4 and sampled at constant intervals by an A/D conversion process, the control circuit 4 produces sampled values as shown in FIG. 6(d). The control circuit 4 repeats calculations on the sampled values and stores amplitudes of the sampled values in the memory table in the RAM 47.

Thus, the memory table shown in FIG. 4 stores amplitudes at sampling points S1, S2, S3, . . . , Sn, differences between previously inputted amplitudes and presently inputted amplitudes at the same sampling points (differences with previous amplitudes), and averaged values of the amplitudes at the sampling points (output average power levels).

The control circuit 4 outputs control signals based on the average amplitudes (output average power levels) in the memory table to the vector adjusters to control adjustments thereof while precluding detected values affected by instantaneous peaks.

In calculating the average amplitudes (output average power levels), the control circuit 4 compares the amplitudes of the detected signals with a predetermined threshold (limit value) for thereby avoiding a vector adjustment control process based on a distortion component signal having an excessive amplitude.

Figure 5:
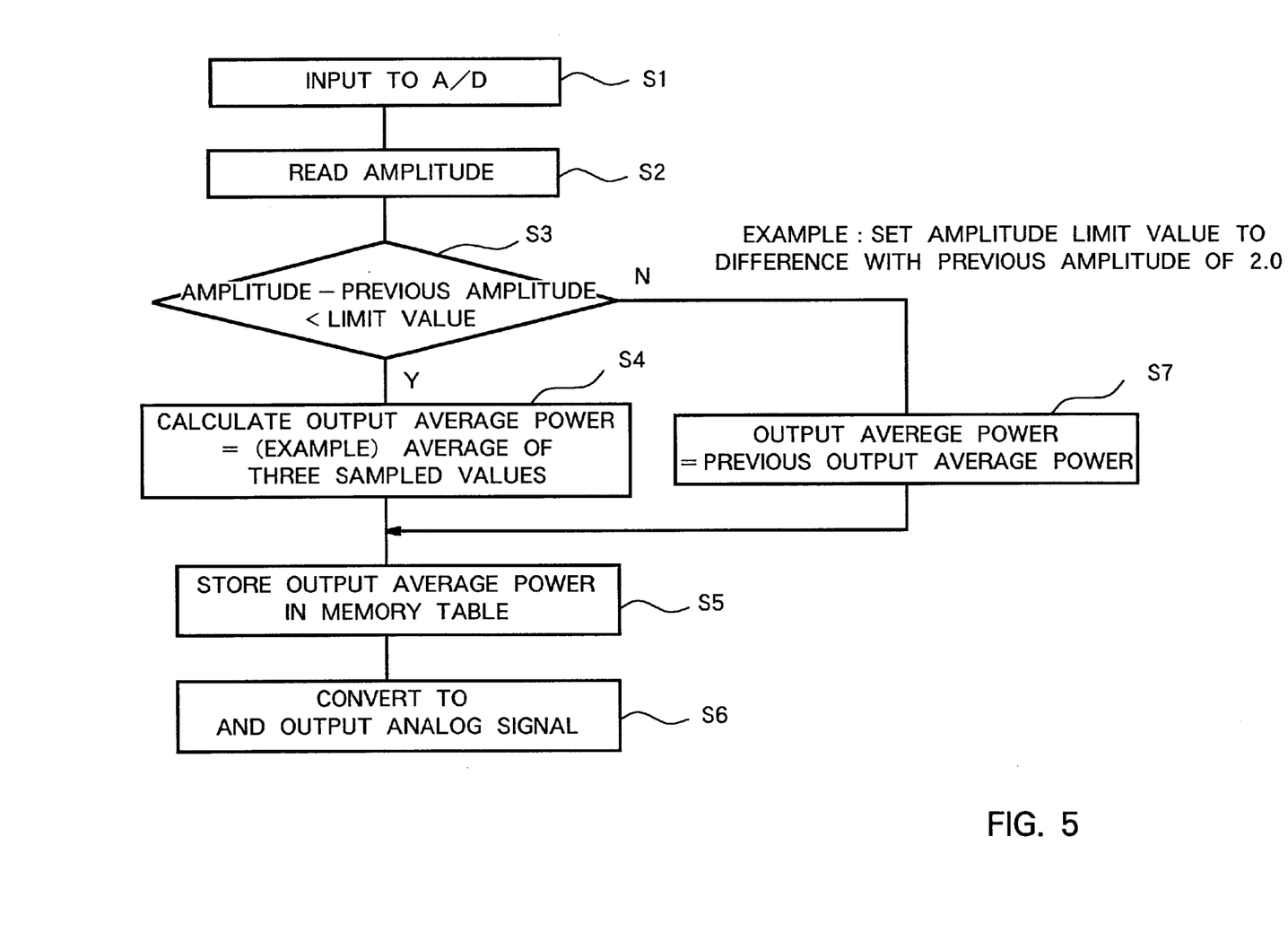
FIG. 5 is a flowchart of a processing sequence carried out by the control circuit.

Such a control process carried out by the control circuit 4 will be described in specific detail below with reference to FIG. 5. For the sake of brevity, a control process based on a signal detected by the detector 2, i.e., the distortion component signal of the RF signal which is introduced by the main amplifier 1 and the pilot signal, will be described below by way of example. However, a control process based on a signal detected by the pilot detector 6 is similarly carried out.

In this example, a limit value for amplitudes, i.e., a threshold for quantities that have varied as compared with previously sampled signals, are set to a 2.0 point. The control circuit 4 performs A/D conversion on a presently sampled signal in step S1, and then reads the amplitude of the signal in step S2.

Then, the control circuit 4 determines the difference between the read amplitude and the amplitude of a previously sampled signal at the same sampling point, i.e., the difference with the previous amplitude, and compares the difference with the previous amplitude with the limit value in step S3.

If the difference with the previous amplitude does not exceed the limit value, then the control circuit 4 calculates an output average power level (amplitude) of the past sampled amplitudes including the presently sampled amplitude in step S4, stores the calculated output average power level in the memory table in step S5, and converts the output average power level into an analog signal and outputs the analog signal to the vector adjuster 3 for adjustment control in step S6.

If the difference with the previous amplitude exceeds the limit value, then the control circuit 4 sets the present output average power level to the output average power level already stored in the memory table in step S7. Thereafter, the control circuit 4 carries out steps S5, S6.

Specifically, if the presently sampled amplitude is greater than the previously sampled amplitude in excess of the threshold, then since the presently sampled amplitude is regarded as being affected by an instantaneous peak, the control circuit 4 controls vector adjustments based on the average value of the past sampled values except for the presently sampled amplitude. Specifically, in the example shown in FIG. 4, since the difference with the previous amplitude (5.0) at the sampling point S7 exceeds the limit value (2.0) due to the peak power level, the control circuit 4 controls vector adjustments using the average value except for the presently sampled value (8.5) at the sampling point S7. At other sampling points, the control circuit 4 controls vector adjustments using the average value including the presently sampled value.

In this embodiment, therefore, even if the input signal contains an instantaneous peak, it is possible to control vector adjustments in a manner to be free of the effect of the instantaneous peak, and to perform stable distortion-compensated signal amplification while preventing the distortion detecting loop from operating in error.

FIG. 7 shows in block form a feed-forward distortion compensation amplifier according to another embodiment of the present invention.

In this embodiment, a pilot signal having a particular frequency generated by a pilot signal generator 20, which is different from the pilot signal from the pilot signal generator 10, is inputted via a coupler 19, and this pilot signal and the inputted RF signal are supplied to the distributor 9. The detector 2 in the embodiment shown in FIG. 1 is replaced with a pilot detector 22 which detects a pilot signal via a coupler 15. A distortion component signal of a pilot signal which is produced by the main amplifier 1 due to the application of an instantaneous peak is detected and inputted to the control circuit 4.

In the embodiment shown in FIG. 7, the inputted RF signal is not to be directly controlled, but the control circuit 4 performs the same control process as described above to effect distortion compensation on the main amplifier 1 based on the distortion component signal of the pilot signal.

In the above embodiments, if a detected signal amplitude (sampled value) is greater than a predetermined threshold, then the average value of past sampled values except for the presently sampled value is used as a substitute value, and vector adjustments are controlled based on the substitute value whose amplitude is smaller than the amplitude threshold. However, the substitute value is not limited to the average value of past sampled values except for the presently sampled value, but may be any of various values described below insofar as it is a value precluding the effect of an instantaneous peak and capable of controlling adjustments made by an adjuster.

The substitute value may be of an amplitude smaller than the amplitude threshold, rather than the average value of past sampled values, or may be one of past sampled values whose amplitude is smaller than the amplitude threshold. If the presently sampled value is greater than the threshold, then the substitute value may be used to control adjustments.

In the above embodiments, when a detected sampled value at a sampling point is greater then a predetermined threshold, the sampled value is used as a substitute value. However, the values at nearby sampling points including the sampling point may be changed to a prepared substitute value. In this manner, the values in a certain sampled range around an instantaneous peak may be changed to perform a control process which is free of the effect of the instantaneous peak.

According to the present invention, as described above, when a signal containing an instantaneous peak power level is inputted, the distortion detecting loop can be controlled while eliminating an effect due to the nonlinearity of the main amplifier such as saturation thereof. Therefore, the feed-forward distortion compensation amplifier according to the present invention suffers little erroneous operation, and is stable as it is capable of recovery from any erroneous operation within a short period of time.

Furthermore, the feed-forward distortion compensation amplifier according to the present invention is suitable for use in CDMA communications, and can operate to perform stable distortion compensation even though a signal having a large peak power level, like a CDMA signal, is inputted as a desired wave.

Although certain preferred embodiments of the present invention have been shown and described in detail, it should be understood that various changes and modifications may be made therein without departing from the scope of the appended claims.

What is claimed is:

1. A feed-forward distortion compensation amplifier having a distortion detecting loop and a distortion compensating loop that are connected in series with each other, wherein in the distortion detecting loop, an input signal is branched into two input signals, one of the branched input signals is amplified by an amplifier whose output signal is branched, such that a branched output signal from the amplifier and the other branched input signal are inverted relative to each other and are combined together to extract a distortion component signal produced by the amplifier, and wherein in the distortion compensating loop, the distortion component signal outputted from the distortion detecting loop and the output signal from the amplifier are inverted relative to each other and are combined together to obtain an amplifier output signal from which the distortion component signal produced by the amplifier has been removed, said feed-forward distortion compensation amplifier comprising:

an adjusting means disposed in said distortion detecting loop, for adjusting said branched output signal from the amplifier and said other branched input signal to amplitudes and phases that are inverted relative to each other;

a detecting means for detecting the distortion component signal extracted by said distortion detecting loop;

a changing means for changing the distortion component signal to a substitute signal having an amplitude smaller than a predetermined threshold if the amplitude of the distortion component signal is greater than the predetermined threshold; and an adjustment control means for controlling said adjusting means based on the amplitudes of the detected distortion component signal and the substitute signal in order to reduce the amplitude of the distortion component signal detected by said detecting means.

2. A feed-forward distortion compensation amplifier according to claim 1, further comprising means for generating a pilot signal having a particular frequency, said pilot signal being inputted as said input signal to said distortion detecting loop.

3. A feed-forward distortion compensation amplifier according to claim 1, wherein said changing means comprises means for, if a sampled value of said detected distortion component signal is greater than a predetermined amplitude threshold, changing said sampled value to a substitute sampled value having an amplitude smaller than the predetermined amplitude threshold;

said adjustment control means comprising means for controlling said adjusting means based on the detected sampled value and said substitute sampled value.

4. A feed-forward distortion compensation amplifier according to claim 3, wherein said substitute sampled value comprises a sampled value having an amplitude smaller than the predetermined amplitude threshold, previously obtained at a sampling point where the sampled value is greater than the predetermined amplitude threshold.

5. A feed-forward distortion compensation amplifier according to claim 3, wherein said substitute sampled value comprises an average value of sampled values having amplitudes smaller than the predetermined amplitude threshold, previously obtained at a sampling point where the sampled value is greater than the predetermined amplitude threshold.

6. A feed-forward distortion compensation amplifier according to claim 3, wherein said distortion detecting loop has second pilot signal generating means for adding a second pilot signal to the input signal applied to said amplifier;

said distortion compensating means comprising:

second adjusting means for adjusting said branched output signal from the amplifier and the distortion component signal from said distortion detecting loop to amplitudes and phases inverted relatively to each other;

an auxiliary amplifier for amplifying the distortion component signal extracted by said distortion detecting loop; and second detecting means for detecting a distortion component signal of the second pilot signal from an output signal of the amplifier from which a distortion component produced by inverting and combining the distortion component signal and the output signal from the amplifier with each other, has been removed;

said changing means comprising means for, if the detected distortion component signal of the second pilot signal has an amplitude greater than a predetermined threshold, changing the distortion component signal to a substitute signal having an amplitude smaller than the predetermined threshold; and said adjustment control means comprising means for controlling said adjusting means and said second adjusting means based on the amplitudes of the detected distortion component signal and the substitute signal in order to reduce the amplitudes of the distortion component signals detected by said detecting means and said second detecting means.

7. A method of amplifying a signal with feed-forward distortion compensation in a distortion detecting loop and a distortion compensating loop, wherein in the distortion detecting loop, an input signal is branched into two input signals, one of the branched input signals is amplified by an amplifier whose output signal is branched, the branched output signal from the amplifier and the other branched input signal are inverted relatively to each other and combined together to extract a distortion component signal produced by the amplifier, and in the distortion compensating loop, the distortion component signal outputted from the distortion detecting loop and the output signal from the amplifier are inverted relatively to each other and combined together to obtain an amplifier output signal from which the distortion component signal produced by the amplifier has been removed, said method comprising the steps of:

detecting a sampled value of the amplitude of the distortion component signal extracted by said distortion detecting loop;

if the detected sampled value has an amplitude greater than a predetermined amplitude threshold, changing said sampled value to a substitute sampled value; and controlling a vector adjuster to adjust amplitudes and phases using said substitute sampled value.

8. A feed-forward distortion compensation amplifier according to claim 2, wherein said changing means comprises means for, if a sampled value of said detected distortion component signal is greater than a predetermined amplitude threshold, changing said sampled value to a substitute sampled value having an amplitude smaller than the predetermined amplitude threshold;

said adjustment control means comprising means for controlling said adjusting means based on the detected sampled value and said substitute sampled value.

9. A feed-forward distortion compensation on amplifier according to claim 8, wherein said substitute sampled value comprises a sampled value having an amplitude smaller than the predetermined amplitude threshold, previously obtained at a sampling point where the sampled value is greater than the predetermined amplitude threshold.

10. A feed-forward distortion compensation amplifier according to claim 8, wherein said substitute sampled value comprises an average value of sampled values having amplitudes smaller than the predetermined amplitude threshold, previously obtained at a sampling point where the sampled value is greater than the predetermined amplitude threshold.

11. A feed-forward distortion compensation amplifier according to claim 8, wherein said distortion detecting loop has second pilot signal generating means for adding a second pilot signal to the input signal applied to said amplifier;

said distortion compensating means comprising:
second adjusting means for adjusting said branched output signal from the amplifier and the distortion component signal from said distortion detecting loop to amplitudes and phases inverted relatively to each other, an auxiliary amplifier for amplifying the distortion component signal extracted by said distortion detecting loop; and second detecting means for detecting a distortion component signal of the second pilot signal from an output signal of the amplifier from which a distortion component produced by inverting and combining the distortion component signal and the output signal from the amplifier with each other, has been removed;

said changing means comprising means for, if the detected distortion component signal of the second pilot signal has an amplitude greater than a predetermined threshold, changing the distortion component signal to a substitute signal having an amplitude smaller than the predetermined threshold; and said adjustment control means comprising means for controlling said adjusting means and said second adjusting means based on the amplitudes of the detected distortion component signal and the substitute signal in order to reduce the amplitudes of the distortion component signals detected by said detecting means and said second detecting means.

12. A feed-forward distortion compensation amplifier comprising:

a distortion detecting loop including a distributor, an amplifier, a splitter, a first inverter, a first combiner, an adjuster, and an extractor, said distributor being operable to split a first input signal into a second input signal and a third input signal, said amplifier being operable to receive the second input signal and outputs a first amplified signal, said splitter being operable to split the first amplified signal into a second amplified signal and a third amplified signal, said first inverter being operable to invert one of the third input signal and the second amplified signal, thereby providing a first inverted signal, said first combiner being operable to combine the other of the third input signal and the second amplified signal with the first inverted signal as supplied from said first inverter, and output a combination signal, said adjuster being operable to adjust the second amplified signal and the third input signal, such that an amplitude of the second amplified signal and an amplitude of the third input signal are inverted relative to each other, and such that a phase of the second amplified signal and a phase of the third input signal are the same, and said extractor being operable to extract and output a distortion component signal from the combination signal, the distortion component signal being produced by said amplifier;

a distortion compensating loop connected in series with said distortion detecting loop, said distortion compensating loop including a second inverter, and a second combiner, said second inverter being operable to invert one of the third amplified signal and the distortion component signal thereby providing a second inverted signal, and said second combiner being operable to combine the other one of the third amplified signal and the distortion component signal with the second inverted signal, as supplied from said second inverter, thereby producing a distortion free signal that does not include the distortion component signal;

a distortion component signal detector being operable to detect the distortion component signal;

a changing unit comprising a changer being operable to change the distortion component signal to a substitute signal having an amplitude smaller than a predetermined threshold if an amplitude of the distortion component signal is greater than the predetermined threshold; and an adjustment control unit comprising an adjuster controller being operable to control the adjuster based on an amplitude of the distortion component signal and an amplitude of the substitute signal in order to reduce an amplitude of the distortion component signal.

13. The feed-forward distortion compensation amplifier as claimed in claim 12, further comprising a pilot signal generator being operable to generate a pilot signal having a pilot frequency, said pilot signal generator being arranged so as to input the pilot signal into said distortion detecting loop.

14. The feed-forward distortion compensation amplifier as claimed in claim 13, further comprising a signal sampler being operable to obtain sampled amplitude values of the distortion component signal at sampling points.

15. The feed-forward distortion compensation amplifier as claimed in claim 14, wherein said changer comprises a sampled value changer being operable to change a sampled amplitude value of the distortion component signal to a substitute sampled amplitude value having an amplitude smaller than a predetermined amplitude threshold, when the sampled amplitude value of the distortion component signal is greater than the predetermined amplitude threshold, and wherein said adjustment control unit further comprises a further adjuster controller being operable to control the adjuster based on the sampled amplitude value of the distortion component signal and the substitute sampled amplitude value.

16. The feed-forward distortion compensation amplifier as claimed in claim 15, wherein the substitute sampled amplitude value comprises a sampled amplitude value having an amplitude smaller than the predetermined amplitude threshold, previously obtained at a sampling point where the sampled amplitude value is greater than the predetermined amplitude threshold.

17. The feed-forward distortion compensation amplifier as claimed in claim 15, wherein the substitute sampled amplitude value comprises an average amplitude value of a plurality of sampled amplitude values, wherein each the plurality of sampled amplitude values has an amplitude smaller than a predetermined amplitude threshold previously obtained at a sampling point where the sampled amplitude value is greater than the predetermined amplitude threshold.

18. The feed-forward distortion compensation amplifier as claimed in claim 15, wherein said distortion detecting loop further comprises a further pilot signal generator being operable to generate a further pilot signal, said further pilot signal generator is arranged so as to add the further pilot signal to the first input signal, wherein said distortion compensating loop further comprises a second adjuster, an auxiliary amplifier, and a pilot distortion component signal detector, said second adjuster being operable to the second amplified signal and the distortion component signal, such that the amplitude of the second amplified signal and the amplitude of the distortion component signal are inverted relative to each other, and such that the phase of the second amplified signal and the phase of the distortion component signal are the same, said auxiliary amplifier being operable to amplify the distortion component signal, and said pilot distortion component signal detector being operable to detect a distortion component signal of the further pilot signal, said pilot distortion component signal detector arranged so as to receive an output from said auxiliary amplifier, in which a distortion component produced by inverting and combining the distortion component signal and the output signal from said amplifier has been removed;

wherein said changing unit further comprises a further changer being operable to change the distortion component signal to a substitute signal having an amplitude smaller than the predetermined threshold if the amplitude of the distortion component signal of the further pilot signal is greater than the predetermined threshold; and wherein said adjustment control unit further comprises a plural adjuster controller being operable to control the adjuster and the further adjuster based on the amplitudes of the detected distortion component signal and the substitute signal in order to reduce the amplitudes of the distortion component signal and the distortion component signal of the further pilot signal.

19. A feed-forward distortion compensation amplifier comprising:

a distortion detecting loop including a distributor, an amplifier, a first directional coupler, an adjuster, and an extractor, said distributor being operable to split a first input signal into a second input signal and a third input signal, said amplifier being operable to receive the second input signal and outputs a first amplified signal, said first directional coupler being operable to split the first amplified signal into a second amplified signal and a third amplified signal, invert one of the third input signal and the second amplified signal, thereby providing a first inverted signal, combine the other of the third input signal and the second amplified signal with the first inverted signal, and output a combination signal, said adjuster being operable to adjust the second amplified signal and the third input signal, such that an amplitude of the second amplified signal and an amplitude of the third input signal are inverted relative to each other, and such that a phase of the second amplified signal and a phase of the third input signal are the same, and said extractor being operable to extract and output a distortion component signal from the combination signal, the distortion component signal being produced by said amplifier;

a distortion compensating loop connected in series with said distortion detecting loop, said distortion compensating loop comprising a second directional coupler being operable to invert one of the third amplified signal and the distortion component signal thereby providing a second inverted signal, and combine the other one of the third amplified signal and the distortion component signal with the second inverted signal, thereby producing a distortion free signal that does not include the distortion component signal;

a distortion component signal detector being operable to detect the distortion component signal;

a changing unit comprising a changer being operable to change the distortion component signal to a substitute signal having an amplitude smaller than a predetermined threshold if an amplitude of the distortion component signal is greater than the predetermined threshold; and an adjustment control unit comprising an adjuster controller being operable to control the adjuster based on an amplitude of the distortion component signal and an amplitude of the substitute signal in order to reduce an amplitude of the distortion component signal.

20. The feed-forward distortion compensation amplifier as claimed in claim 19, further comprising a pilot signal generator being operable to generate a pilot signal having a pilot frequency, said pilot signal generator being arranged so as to input the pilot signal into said distortion detecting loop.

21. The feed-forward distortion compensation amplifier as claimed in claim 20, further comprising a signal sampler being operable to obtain sampled amplitude values of the distortion component signal at sampling points.

22. The feed-forward distortion compensation amplifier as claimed in claim 21, wherein said changer comprises a sampled value changer being operable to change a sampled amplitude value of the distortion component signal to a substitute sampled amplitude value having an amplitude smaller than a predetermined amplitude threshold, when the sampled amplitude value of the distortion component signal is greater than the predetermined amplitude threshold, and wherein said adjustment control unit further comprises a further adjuster controller being operable to control the adjuster based on the sampled amplitude value of the distortion component signal and the substitute sampled amplitude value.

23. The feed-forward distortion compensation amplifier as claimed in claim 22, wherein the substitute sampled amplitude value comprises a sampled amplitude value having an amplitude smaller than the predetermined amplitude threshold, previously obtained at a sampling point where the sampled amplitude value is greater than the predetermined amplitude threshold.

24. The feed-forward distortion compensation amplifier as claimed in claim 22, wherein the substitute sampled amplitude value comprises an average amplitude value of a plurality of sampled amplitude values, wherein each the plurality of sampled amplitude values has an amplitude smaller than a predetermined amplitude threshold previously obtained at a sampling point where the sampled amplitude value is greater than the predetermined amplitude threshold.

25. The feed-forward distortion compensation amplifier as claimed in claim 22, wherein said distortion detecting loop further comprises a further pilot signal generator being operable to generate a further pilot signal, said further pilot signal generator is arranged so as to add the further pilot signal to the first input signal, wherein said distortion compensating loop further comprises a second adjuster, an auxiliary amplifier, and a pilot distortion component signal detector, said second adjuster being operable to adjust the second amplified signal and the distortion component signal, such that the amplitude of the second amplified signal and the amplitude of the distortion component signal are inverted relative to each other, and such that the phase of the second amplified signal and the phase of the distortion component signal are the same, said auxiliary amplifier being operable to amplify the distortion component signal, and said pilot distortion component signal detector being operable to detect a distortion component signal of the further pilot signal, said pilot distortion component signal detector arranged so as to receive an output from said auxiliary amplifier, in which a distortion component produced by inverting and combining the distortion component signal and the output signal from said amplifier has been removed;

wherein said changing unit further comprises a further changer being operable to change the distortion component signal to a substitute signal having an amplitude smaller than the predetermined threshold if the amplitude of the distortion component signal of the further pilot signal is greater than the predetermined threshold; and wherein said adjustment control unit further comprises a plural adjuster controller being operable to control the adjuster and the further adjuster based on the amplitudes of the detected distortion component signal and the substitute signal in order to reduce the amplitudes of the distortion component signal and the distortion component signal of the further pilot signal.

26. A method of amplifying a signal with feed-forward distortion compensation amplifier comprising a distortion detecting loop including a distributor, an amplifier, a splitter, a first inverter, a first combiner, and an extractor, and a distortion compensating loop connected in series with the distortion detecting loop, the distortion compensating loop including a second inverter and a second combiner, the distributor being operable to split a first input signal into a second input signal and a third input signal, the amplifier being operable to receive the second input signal and output a first amplified signal, the splitter being operable to split the first amplified signal into a second amplified signal and a third amplified signal, the first inverter being operable to invert one of the third input signal and the second amplified signal, thereby providing a first inverted signal, the first combiner being operable to combine into an combination signal, the other of the third input signal and the second amplified signal with the first inverted signal as supplied from the first inverter, and output the combination signal, the extractor being operable to extract and output a distortion component signal from the combination signal, the distortion component signal being produced by the amplifier, the second inverter being operable to invert one of the third amplified signal and the distortion component signal thereby providing a second inverted signal, and the second combiner being operable to combine the other one of the third amplified signal and the distortion component signal with the second inverted signal, as supplied from said second inverter, thereby producing a distortion free signal that does not include the distortion component signal, said method comprising:

extracting a distortion component signal with the distortion detecting loop;

detecting a sampled amplitude value of the distortion component signal extracted by the distortion detecting loop;

changing the sampled amplitude value of the distortion component signal to a substitute sampled amplitude value when the detected sampled amplitude value of the distortion component signal is greater than a predetermined amplitude value; and controlling a vector adjustor to adjust amplitudes and phases using the substitute sampled amplitude value.

* * * * *